(12) United States Patent
Savell et al.

(10) Patent No.: US 6,324,235 B1
(45) Date of Patent: Nov. 27, 2001

(54) ASYNCHRONOUS SAMPLE RATE TRACKER

(75) Inventors: Thomas C. Savell, Santa Cruz; David Rossum, Monterey, both of CA (US)

(73) Assignee: Creative Technology, Ltd., Singapore (SG)

( * ) Notice: Subject to any disclaimer, the term of this patent is extended or adjusted under 35 U.S.C. 154(b) by 0 days.

(21) Appl. No.: 09/084,154

(22) Filed: May 20, 1998

Related U.S. Application Data (63) Continuation-in-part of application No. 08/968,601, filed on Nov. 13, 1997.

(51) Int. Cl.[7] .................................................. H04L 25/00
(52) U.S. Cl. ............................................................. 375/372
(58) Field of Search ................................... 375/372, 373, 375/376

(56) References Cited

U.S. PATENT DOCUMENTS

| | | | |
|---|---|---|---|
| 4,388,727 | * | 6/1983 | Metcalf ................................. 375/334 |
| 4,941,156 | * | 7/1990 | Stern et al. ........................... 375/372 |
| 5,230,097 | * | 7/1993 | Currie et al. ....................... 455/226.1 |

* cited by examiner

Primary Examiner—Chi Pham
Assistant Examiner—Kevin M Burd
(74) Attorney, Agent, or Firm—Kenneth R. Backus, Jr.; Townsend and Townsend and Crew LLP (57) ABSTRACT

An asynchronous sample rate tracker based on a phase-locked loop quickly locks to an input sample rate, even when the input sample rate equals the resident, or internal, sample rate of an asynchronous digital sample rate converter. The phase difference between the input write data and output read data is maximized to reduce data lost due to excursions in the input sample rate. In one embodiment, a binary shift register is used to generate a read pointer step size according to the derivative of the difference between a write pointer position and a read pointer position.

11 Claims, 5 Drawing Sheets

(BUFFER: Prior Art)
FIG. 1

ASYNCHRONOUS SAMPLE RATE TRACKER

CROSS REFERENCES TO RELATED APPLICATIONS

This application is a continuation-in-part and claims priority from U.S. patent application Ser. No. 08/968,601, filed Nov. 13, 1997, entitled ASYNCHRONOUS SAMPLE RATE TRACKER, which is herein incorporated by reference for all purposes.

BACKGROUND OF THE INVENTION

This invention generally relates to circuits for converting input data received at a first sample rate into corresponding output data at a second sample rate. More particularly, this invention relates to tracking an input sample rate to maintain a relationship between the rate at which input data is received and the rate at which output data is provided.

Many audio devices, such as computer sound cards and recording studio equipment, receive, transmit, and manipulate audio information in a digital, rather than analog, form. Some audio sources, such as compact-disk players, Z-Video players, and digital video disks, generate a digital signal directly. Other audio sources, such as microphones, generate an analog signal, which can be converted to a digital signal with an analog-to-digital converter ("ADC"). An ADC typically "samples" the analog signal at a rate high enough to preserve the acoustic characteristics of the analog audio signal. However, with either data from a digital signal source, or from an analog signal source converted by an ADC, the data rate of the source may be different from the rate at which a digital audio device manipulates data. Digital audio devices that can receive digital data streams from a variety of sources at a variety of data rates often include digital sample rate converters that convert the input sample rate to an output sample rate that is compatible with the digital audio device.

Digital sample rate converters can be either synchronous or asynchronous. A synchronous sample rate converter shares a common time base, or clock, with the input signal source. In order for a synchronous sample rate converter to operate, it must be able to lock to the clock signal used by the input device, and the input device must provide a clock output or a third device must provide a common clock output. An asynchronous sample rate converter does not require a common time base with the input signal source, and can accept input data from a wide variety of sources. An asynchronous digital sample rate converter can convert between any two sample rates within the operating range of the converter.

One type of asynchronous digital sample rate converter takes an input sample stream, converts it to an analog signal with a digital-to-analog converter (DAC), and then converts that analog signal back to a digital signal at the desired output sample rate with an ADC. This approach is simple to understand and direct, but is complex to implement and produces an inferior signal because of the distortion and noise that the ADC and DAC add.

An alternative to asynchronous digital sample rate conversion is to use a phase-locked-loop approach. The phase-locked loop approach adapts the output data rate to the input data rate by adjusting the internal clock rate of the receiving device to the clock rate of the input device. The clock rate of the input device and the internal clock rate are both provided to a mixer, the mixer output, or product, is zero when the two rates are the same, and when the two clock rates are not the same, the mixer output is converted into a signal that adjusts the internal clock rate. This process can take several seconds to achieve lock and limits input data to those signals with a clock rate within the tuning range of the internal clock. The time-to-lock can be especially undesirable if the input clock rate is not constant, but drifts or otherwise changes. Another disadvantage of this approach is that, while the two clock rates are frequency matched, no phase relationship between the input and output data is maintained, which could lead to a loss of input data if the input data overwrites valid data. This also precludes the use of more than one asynchronous stream at a time, or mixing of a fixed-rate internal signal with the external asynchronous signal.

Figure 1:
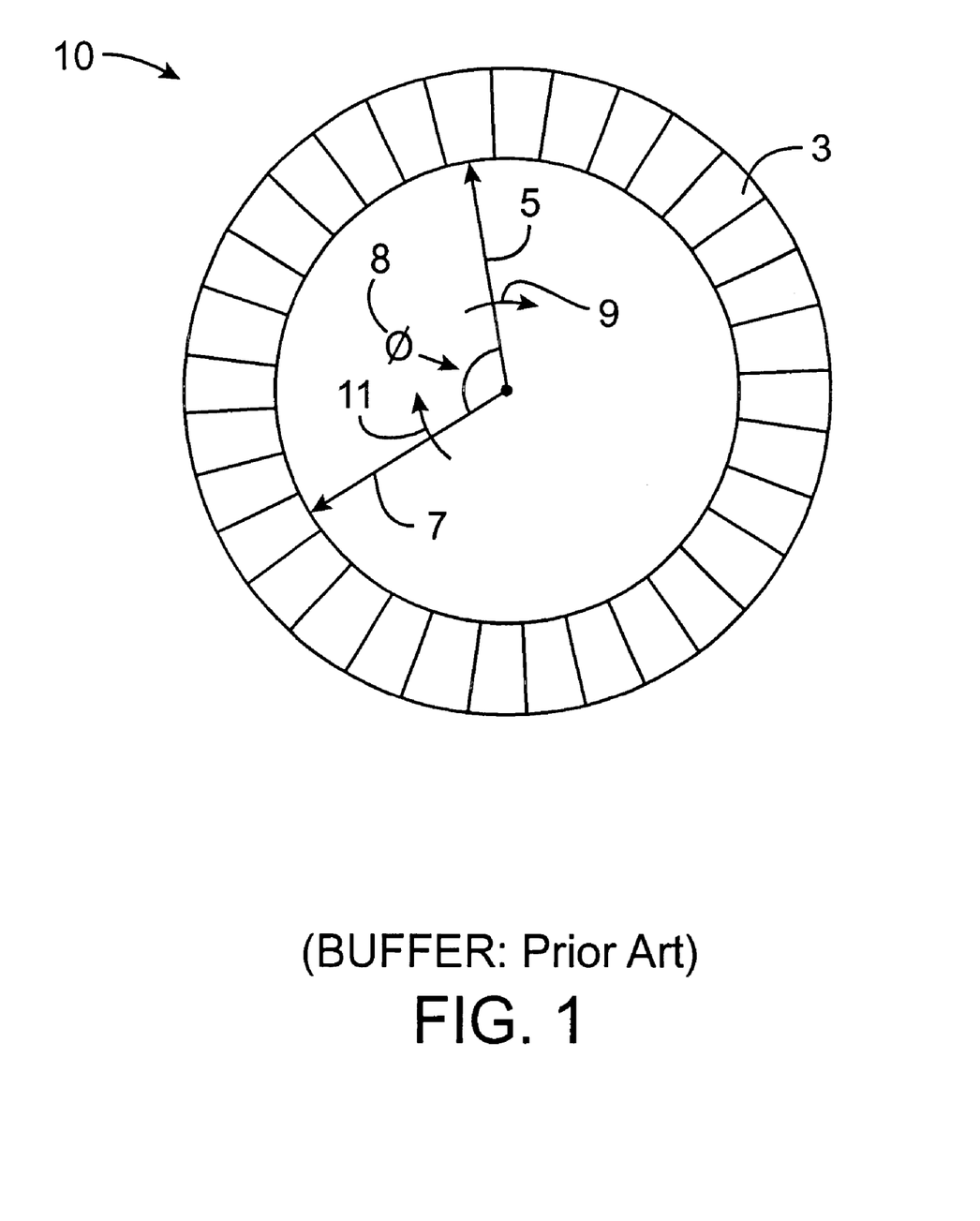
FIG. 1 is a simplified representation of a buffer showing the relationship between a read pointer and a write pointer.

Many sample rate converters temporarily store the input data in a random-access memory ("RAM"), or other type of memory, to buffer the data while the sample rate conversion process proceeds. The RAM has a finite capacity and can not store an endless stream of input data; therefore, once an input value is read from a RAM address, that address becomes available for another input data point. FIG. 1 shows a simplified representation of a buffer 10 that is configured as a circle for illustrative purposes. Each segment 3 of the buffer represents an address where a data point may be written to or read from. The next input data point will be read into the buffer at the input data pointer location 5, writing over the value stored in that location, which has already been read. The next output data point will be read from the buffer at the output data pointer location 7. Both pointers will increment in the same direction around the buffer, represented by arrows, according to the input sample rate 9 and the output sample rate 11. The distance between the input pointer 5 and the output pointer 7 is represented as a phase angle 8. If the input sample rate suddenly increases, the input data pointer might overrun the output data pointer, writing over data that has not yet been read. In a phase-locked system that does not account for the phase relationship between the input data sample rate and the output data sample rate, small excursions in the input data sample rate might cause the input data pointer to overrun valid data in the buffer.

Therefore an asynchronous sample rate tracker that achieves lock quickly and maintains an optimum input buffer configuration and signal fidelity is desirable.

SUMMARY OF THE INVENTION

According to the present invention, a method and apparatus of tracking and locking to an asynchronous input sample rate is provided for use in a digital device, for example a digital audio sound card. In an embodiment, a read rate is estimated according to the slope of the phase error between an input sample rate and a read rate, and phase correction is provided according to the read rate and the phase error. A convolver converts the read rate to an output rate at the internal data rate of the digital device.

In a specific embodiment, a phase detector produces a phase error signal based on the positions of a write pointer and a read pointer in a FIFO buffer. The FIFO buffer receives data at an input data rate that is asynchronous to the internal data rate of the digital device receiving the input data. A differentiator in a phase estimator produces a phase error slope signal that is provided to a scaler that adjusts the read rate based on the current read rate correction step size and the magnitude of the phase error slope. The scaler is a binary shift register, but could be a multiplier.

In another embodiment, a step size adjuster adjusts the read rate correction step size according to the sign of the phase error slope. The step size is increased if the sign of the slope remains the same for a selected number of cycles, and is decreased if the sign of the slope changes or is zero for selected numbers of cycles. The step size adjustment is applied to a current step size, which may be used by the scaler in adjusting the read rate.

In yet another embodiment, a phase corrector produces a phase correction signal to momentarily alter the read rate to restore a selected phase relationship between the read pointer and the write pointer. The phase correction signal is generated from the phase error signal and the read rate to rapidly restore the desired phase without unduly affecting the output of the rate converter.

DESCRIPTION OF THE PREFERRED EMBODIMENT

I. Overview of the Sample Rate Converter

The present invention provides a method and an apparatus for tracking an asynchronous sample rate, such as would be provided to an asynchronous sample rate converter. An asynchronous sample rate converter may be used in a digital audio processor, for example, or may be used in other devices that convert a first digital data stream to another digital data stream, where the two data streams do not share a common time base, such as data modems, digital signal analyzers, video processors, receivers, and other devices. An asynchronous sample rate tracker according to one embodiment of the present invention quickly achieves a stable lock to the input sample rate by scaling a step adjustment to the output sample rate according to, among other things, the detected difference between input and output sample rates. A quick and stable lock is obtained even when the input and output sample rates are identical. The tracker minimizes the potential for losing data due to excursions in the input sample rate by maintaining a phase relationship between the input data and the output data.

Figure 2A:
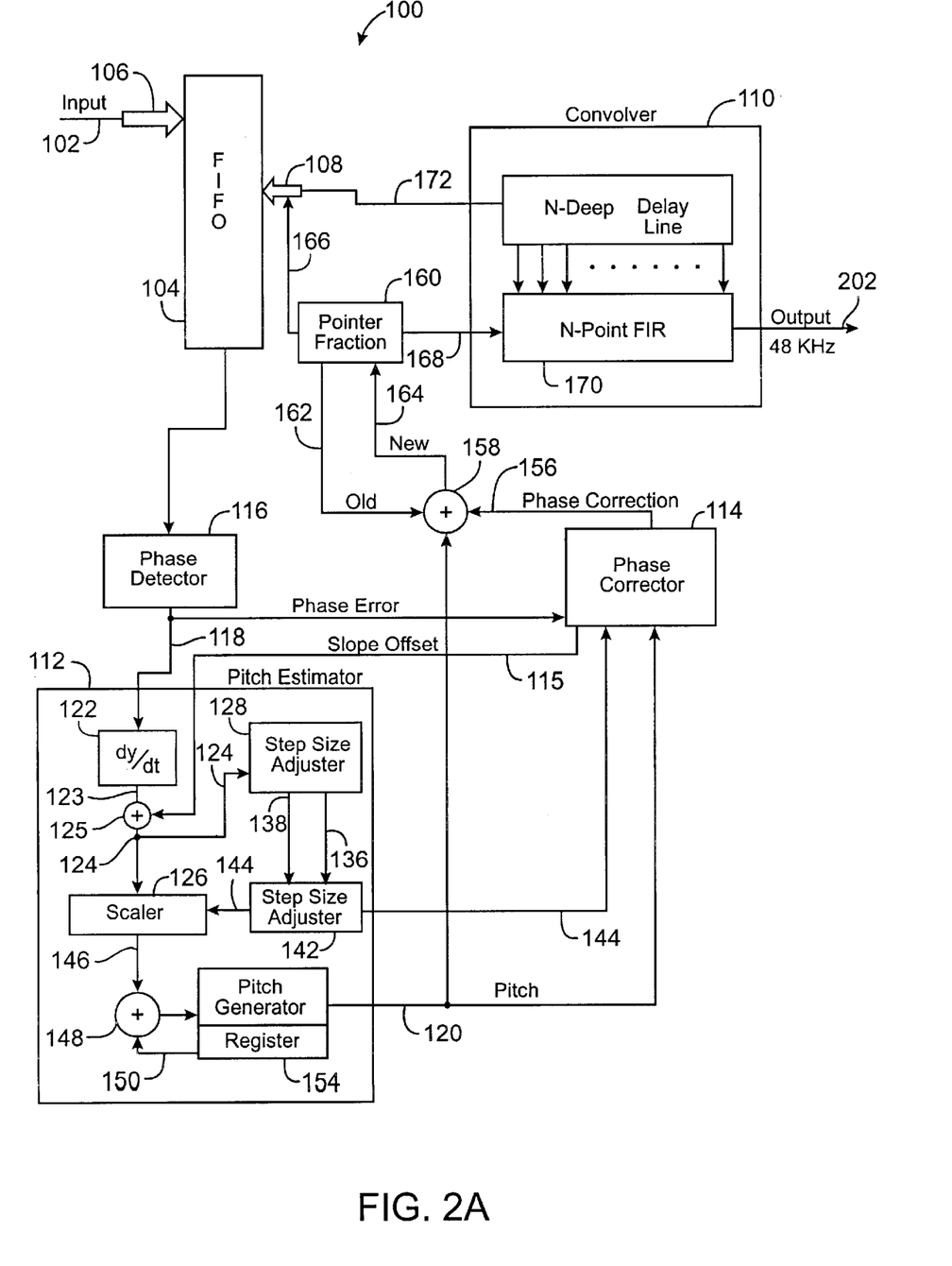
FIG. 2A is a simplified block diagram of a sample rate converter, including a sample rate tracker, according to an embodiment of the present invention.

FIG. 2A is a simplified block diagram of an asynchronous rate converter 100. Input data 102 is streamed into a 16-point first-in-first-out (FIFO) buffer 104. The location of the next input data point is indicated by a write pointer 106. A read pointer 108 indicates the location of the next output data point. To minimize the possibility of overwriting valid data before it can be read due to an excursion in the input sample rate, it is desirable to keep the write pointer and the read pointer as far apart as possible. In other words, it is desirable to keep the distance between the write pointer and the read pointer, as measured in data point locations in the FIFO buffer, equal to half the buffer size, in this case 8 point locations.

The difference between the write pointer location and the read pointer location minus one half the buffer size is called the "FIFO count". For example, if the FIFO buffer has 16 addresses and the read pointer is at FIFO address 4, while the write pointer is at FIFO address 10, the difference between the pointers (6) minus one half the buffer size (8), results in a FIFO count of −2. For the purposes of this application, the FIFO count is also referred to as "phase error". It is understood that the "difference between the pointers" refers to the number of addresses that the read pointer would have to advance in order to overtake the write pointer, and not simply the absolute value of one buffer address subtracted from another. The latter does not necessarily provide the correct polarity or magnitude of the FIFO count when the write pointer passes through the initial buffer address (i.e. when the write pointer has a lower address value than the read pointer). The optimal phase error is 0, which occurs when the write pointer is separated from the read pointer by one half the buffer. The sample rate tracker can momentarily change the output sample (read) rate to provide a FIFO count of 0 so that the maximum phase difference between the write pointer and the read pointer is maintained.

For example, if the input sample rate is 44.1 kHz, and the output rate is 48 kHz, the nominal rate at which data is read from the buffer is 44.1 kHz. Otherwise, the write pointer and read pointers would not maintain a half buffer distance between them. Thus, the read rate "tracks" the input sample rate. The converter 110 interpolates, in this instance, additional data points to provide an output data stream at the internal clock rate of 48 kHz, as is known in the art. If the read rate was consistently greater than the write rate, the read pointer would periodically overtake the write pointer (like the minute hand overtaking the hour hand on a clock) and read stale data (data that has already been read and is no longer valid) from the buffer. If the read rate was consistently less than the write rate, the write pointer would periodically overtake the read pointer and overwrite valid data before that data could be read.

II. A General Description of a Pitch Estimator

As discussed above, in an asynchronous system, the signal source that is providing the input data stream does not share a common time base with the digital device that is receiving the data stream. Therefore, the digital device must determine the input sample rate from the input data stream in order to track the input data. This may be done by evaluating the difference between the location of the read pointer and the write pointer, and more specifically, by evaluating the rate of change of position between the pointers.

Ideally, the read rate is identical to the write rate, and the read pointer is 180 degrees out of phase (one half buffer distance from) the write pointer. However, the write rate may drift or jitter. If the read rate is too fast or too slow, then there is, or was, an error in the read rate, and the read rate must be corrected in order to maintain tracking at the proper phase relationship to the write rate. At least two types of corrections to the read rate may be appropriate. The first type of correction is made to match the read rate to the write rate, to account for a drift in the write rate, for example. The other type of correction is a momentary adjustment that moves, or "kicks", the read pointer to the correct location in the buffer to maintain 180 degrees of phase difference from the write pointer, to account for jitter in the write rate, for example. It is possible to provide both types of corrections simultaneously; however, it is desirable that any correction occur quickly and in a stable fashion. That is, it is undesirable for the read pointer to overshoot the intended location, or to oscillate about the intended location by more than the minimum pitch correction step size.

The read rate is also called the "pitch". The error in the pitch can be determined by differentiating the error in the phase (FIFO count), as the phase is the integral of the pitch:

$$\theta = \text{phase} \quad (Eq.\ 1)$$

$$\theta = \int \text{pitch}\, dt \quad (Eq.\ 2)$$

thus $$\text{pitch} = d\theta/dt \quad (Eq.\ 3)$$

It then follows that the derivative of the phase error is equal to the pitch error:

$$\epsilon_{pitch} = d\epsilon_{phase}/dt \quad (Eq.\ 4)$$

While the mathematics shown above describe the relationship between phase and pitch in continuous time, an implementation suitable for a digital device must be realized in discrete time. The derivation of the mathematics for a discrete-time relationship between phase and pitch are:

$$\text{phase}(T) = \Sigma^{T}_{t=0} \text{pitch}(t) \quad (Eq.\ 5)$$

$$\text{pitch}(t) = \Delta \text{phase}(t) \quad (Eq.\ 6)$$

$$\epsilon_{pitch}(t) = \Delta \epsilon_{phase}(t) \quad (Eq.\ 7)$$

The error is measured in a relatively coarse discrete step, therefore the exact magnitude of the pitch error cannot be determined directly from the delta phase error. To overcome this problem, a gradient descent approach is used. The goal of the gradient descent approach is to find the global minimum in error space.

Basically, the step size taken to correct the read rate (change in pitch) is chosen to be a fraction of the derivative of the phase error. When the derivative of the phase error is zero, no pitch corrections will occur, meaning that the system has settled at the minimum in error space. The step size starts out as a relatively large fraction of the derivative of the phase error, and is scaled down as the pitch estimate becomes closer to the true pitch (when the read rate is equal to the write rate). This allows the pitch estimator to converge quickly as it approaches true pitch. The pitch estimate can be made arbitrarily accurate, with correspondingly longer convergence times.

One difficulty with this approach is determining how close the pitch estimate is to the true pitch. One solution is presented by noting that if the sign of the pitch error (the differential of the phase error) stays the same on successive sample periods, the pitch estimate is not very close, and the step size should be increased or remain at the maximum value to obtain true pitch as quickly as possible. However, if the sign of the pitch error alternates on successive sample periods, it means that the pitch estimate is close, and that the step size should be decreased in order to converge on the true pitch. Eventually, the minimum step size will be reached and the sign of the pitch error will dither at true pitch. For the purpose of the above solution, successive sample periods mean those sample periods at which a non-zero slope, phase error, is measured since zero slope periods contain no information relating to phase error. An example is illustrated in Table 1, below:

TABLE 1

| $\epsilon_{phase}$ | $d\epsilon_{phase}$ | step size action |
|---|---|---|
| 8 | 0 | none |
| 7 | −1 | none |
| 6 | −1 | increase step size |
| 5 | −1 | increase step size |
| 4 | −1 | increase step size |
| 4 | 0 | none |
| 4 | 0 | none |
| 3 | −1 | increase step size |
| 4 | 1 | decrease step size |
| 4 | 0 | none |
| 3 | −1 | decrease step size |
| 3 | 0 | none |
| 4 | 1 | decrease step size |
| 4 | 0 | none |

This approach provides a quick and stable signal lock when the input sample rate is different from the output sample rate; however, as discussed above, instances may arise when the input rate is nominally equal to, but asynchronous with, the output rate (i.e. the source and the digital device receiving the signal from the source have nominally identical clock rates, e.g. 48 kHz, that are not referenced to a common time standard). In that instance, the time to decrease the pitch correction step size approaches infinity as the ratio of the input rate to the output rate approaches 1 because the phase can remain the same over many successive samples. If there is no change in phase, there is no change in the phase error rate, and the slope of the phase error rate is zero. As shown above in Table 1, if the phase error rate is zero, no step size action is taken. Additionally, if the step size is large the system will require a long time to achieve lock, which is undesirable.

To quickly lock when the input rate and output rate are close enough to result in a zero phase error rate, a counter is provided that increments every time a zero phase error rate is detected. Each time the counter overflows, the step size is decreased. The counter overflow limit is chosen appropriately low so that the step size decrements fast enough to provide a quick lock. If the input and output rates are essentially equal, the pitch correction step size will eventually reach a minimum step size, at which time the phase error slope rate typically dithers between positive and negative, indicating the desired locked condition.

Changes to the step size based on a buffer accumulating phase error slope information take at least a few cycles to occur. It is also desirable to more rapidly adjust the pitch to account for essentially instantaneous changes in the phase error signal. It is understood that the systems being described are digital, and that the term "essentially instantaneous" refers to events occurring within or between a clock cycle. It is also understood that the electric components of the sample rate converter might operate at a frequency that is much higher, perhaps several orders of magnitude higher, than the output sample rate. To achieve a rapid response to changes in the phase error, a scaler was provided to update the read rate during each cycle, based on the current phase error signal and the current step size.

III. A General Description of the Phase Corrector

The method described in section II, above, will converge on the correct pitch, but will not necessarily maintain a particular phase relationship (buffer address differential) between the write pointer and the read pointer. As discussed above, it is desirable to maintain nominally 180 degrees of phase difference, or one half the buffer size, between the write pointer and the read pointer to minimize the chance that excursions in the input sample rate cause valid data to be overwritten, or stale data to be read. Any offset in the phase is filtered out by the differentiator that produces the phase error signal used in the phase estimator. Therefore, a phase corrector is used to apply a phase correction factor to the pitch. This phase correction factor, or pitch adjustment, can be thought of as a bump or kick to the estimated pitch (read rate), produced by the pitch estimator. This phase correction factor is applied to the estimated pitch only if the phase error is outside of a selected window to avoid audible distortions in the read data at or near lock. The correction factor is increased as the phase error increases to force the phase difference to the desired value more quickly.

IV. Description of an Asynchronous Sample Rate Tracker

Referring again to FIG. 2A, a simplified block diagram of a sample rate converter 100, including a buffer 104, a pitch estimator 112, a phase corrector 114, a convolver 110, and other elements, is shown. The convolver 110 converts the nominal read rate to the system rate by interpolating or decimating data points in the data stream, as is known in the art. In a particular embodiment, the convolver included an N-deep delay line and an N-point finite-impulse-response ("FIR") filter, although other types of convolvers or rate converters could be used.

The buffer 104 is a 16-input-point FIFO buffer that receives input data 102 from a source (not shown), such as a digital video disk. A write pointer 106 determines the location of the buffer address (not shown) that will receive a data point (not shown). The write pointer moves to a new buffer address on each input cycle, hence the write rate is determined by the data source rate. A read pointer 108 determines the location of the buffer address from which a data point will be read. The read pointer also moves to a new buffer address on each read cycle. As discussed above, it is desirable that the read rate equal the write rate, and that the read pointer and the write pointer are separated by one half the buffer size.

A phase detector 116 receives the write pointer 106 and read pointer 108 address locations and determines the FIFO count, which is the separation between the address locations of the two pointers minus one half the number of addresses in the buffer. It is understood that the relative signs of the values and the adjustment of the pointer separation value by a fraction of the buffer size is a matter of choice. The output of the phase detector is expressed as a phase error signal 118. The phase error signal is provided to both the pitch estimator block 112 and the phase corrector block 114.

The pitch estimator block 112 produces a pitch 120, or read rate, based on the phase error signal 118 from the phase detector 116. A differentiator 122 produces a phase error slope signal 124 and provides this phase error slope signal to a scaler 126 and a step size adjuster 128. The phase error slope signal indicates the rate of change of the phase error and the direction (sign of the slope) of change, but does not provide an indication of an offset, or "DC", component of the phase error. For example, the differentiator can determine if the write pointer suddenly "sped up" with respect to the read pointer, but cannot determine if the write pointer has the desired separation from the read pointer.

Figure 3:
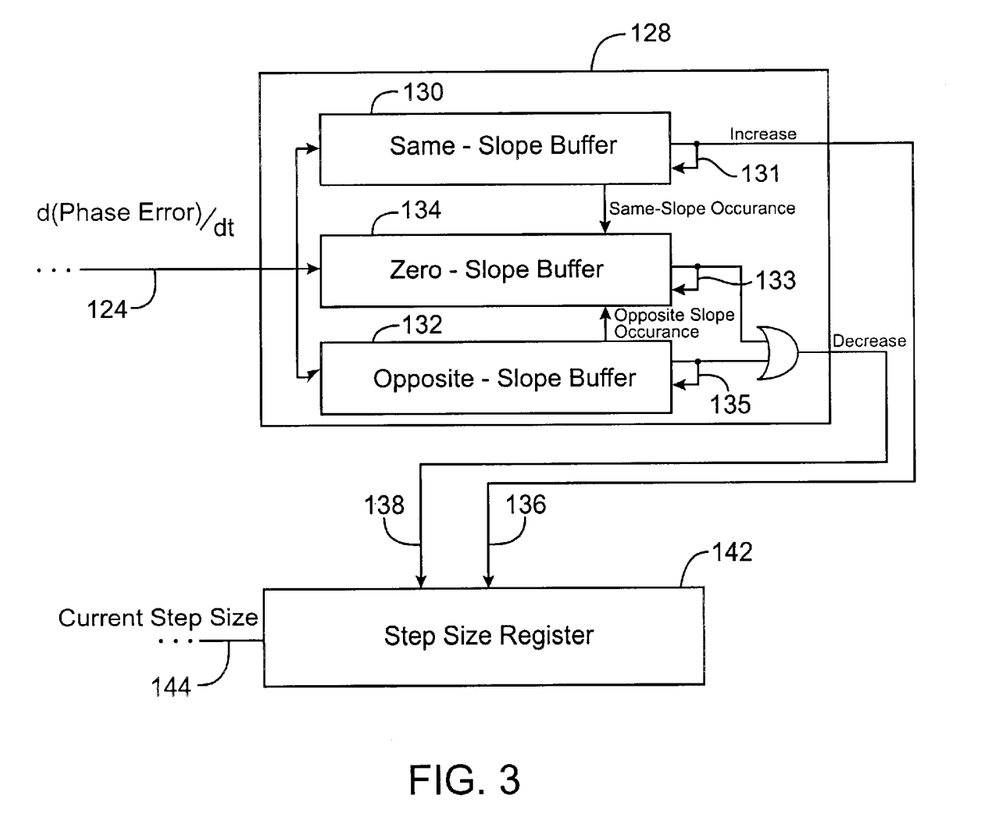
FIG. 3 is a simplified block diagram of an embodiment of a step size adjuster according to an embodiment of the present invention.

FIG. 3 is a simplified block diagram of the step size adjustor 128. The step size adjuster 128 receives the phase error slope signal 124 and produces a new pitch step size signal, if appropriate. The step size adjuster determines whether a new pitch step size is appropriate based on the sign of the slope of the phase error slope signal. The step size adjuster has three buffers: a same-slope buffer 130, a opposite-slope buffer 132, and a zero-slope buffer 134. On successive write cycles, the phase error slope signal will meet one of three conditions: the sign of the slope will be the same as on the previous cycle, the sign of the slope will be the opposite of what it was on the previous cycle, or the slope will be zero, indicating that the input rate is very close to the read rate. Each buffer acts as a counter and increments each time a phase error slope signal meeting the buffer criteria occurs. The counter function is achieved by choosing the size of each buffer so that the buffer will overflow after the desired number of cycles occurs. The size, or width, of a buffer determines its time constant, that is, how long it will take the buffer to overflow at a given cycle rate. The time constant determines the time-to-lock, stability, and input frequency range of the phase-locked tracker.

In a particular embodiment, the same-slope buffer 130 is 2-bits wide, and therefore counts from 0 to 3. The opposite-slope buffer is 4-bits wide and counts from 0 to 15. The asymmetry between the width of the opposite-slope buffer and the same-slope buffer provides hysteresis, or damping, to the system, thus preventing oscillations and providing a stable lock, while allowing the system to respond quickly to changes in the input frequency. The zero-slope buffer has a width of 8 bits, and therefore counts from 0 to 255, which was chosen to provide rapid and stable locking when the input signal rate is close to the read rate or the output rate. It is understood that a smaller or greater width could be chosen for any buffer according to the desired locking speed, stability, and trackable range.

As discussed above in section II, the step size adjuster outputs an increase step size signal 136 each time the same-slope buffer overflows, and a decrease step size signal 138 each time the opposite-slope buffer 132 or the zero-slope buffer 134 overflows. The buffers also generate a reset signal 131, 133, 135 when the buffer overflows. A non-zero slope input also resets the zero-slope buffer. The outputs of the step size adjuster 128 are provided to a step size register 142. The step size adjuster does not necessarily provide a step size adjustment on every input cycle, as it typically takes several cycles to overflow a buffer. The step size register holds the current step size value 144 and provides it to the scaler. The step size is incremented or decremented by a factor of 2 each time an increase step size signal or a decrease step size signal is provided. The factor of 2 is a digital optimization for the type of scaler used, which is a shifter, and could be another value.

Referring again to FIG. 2A, the scaler 126 is a binary shift register, but could also be a multiplier, for example. The scaler receives the phase error slope signal 124 from the differentiator 122 and current step size value 144 from the step size register 142 to produce a new estimated step size signal 146. The scaler, unlike the step size adjuster, operates on each input cycle. The scaler essentially instantaneously compensates for changes in the phase error by scaling the pitch step size according to the magnitude of the phase error signal 124 (as opposed to the sign of the phase error signal used in the step size adjuster) and according to the current step size 144. This new estimated step size signal 146 is used to generate the read rate, or pitch.

A summing unit 148 adds the current estimated pitch signal 150 from the pitch generator 152, which includes pitch register 154, and the new estimated step size signal 146 to produce a new estimated pitch signal 120. The pitch was chosen to be a fixed-point number in 1.18 format, thus providing a frequency resolution of 48,000/262,144 (the resident internal clock rate of 48 kHz divided by $2^{18}$), or 0.183 Hz. The maximum step size was chosen according to the desired response speed and is 1/1024. This value provides a desirable balance between fast convergence while maintaining stability, but other values could have been chosen.

The phase corrector 114 maintains the correct phase separation between the read pointer and the write pointer while maintaining signal fidelity. The phase corrector receives the phase error signal 118 from the phase detector 116, the current step size value 144 from the step size register 142, and the estimated pitch signal 120 from the pitch estimator 112, and produces a phase correction signal 156. The intent of the phase correction signal is to bump, or "kick", the read pointer in the proper direction of the buffer addresses to maintain the desired separation between the read pointer and the write pointer, e.g. one half the buffer size, or eight addresses of separation. The phase corrector does this by providing an altered-pitch signal that is a fraction of the current pitch, to a second summing unit 158. The second summing unit 158 adds the phase correction signal 156, the estimated pitch signal 120, and other terms, and will be discussed in further detail below.

The phase corrector adapts the phase correction signal based on the phase error signal, the pitch, and the current step size. Combining these parameters provides for efficient phase correction while avoiding undesirable audible events in the output signal. For example, if the current step size is small, the system is considered locked and a momentary excursion outside of the desired phase window is expected and should be relatively benign. A large phase correction might result in a discontinuity in the data stream that manifests as an audible event on the output 202. Therefore, if the step size is small, a smaller phase correction signal is desired, and should not result in a slower return to zero phase error because the read rate is very close to the write rate. The exact values are chosen according to system requirements, such as maximum allowable distortion, internal clock rate, allowable input rates, expected source stability, input buffer size, and output frequency range, among others.

The phase corrector produces no phase correction signal if the phase error is within a particular range, in this instance when the phase error is +1, 0, or −1 (representing a separation between the read pointer and write pointer of 7, 8, or 9 buffer addresses). If the phase error is outside of this range, the phase corrector inflates or deflates the pitch estimate for one cycle only by dividing the pitch by a factor of $2^N$. When the phase difference is outside of this range , a one-time phase correction of ±pitch/32 is applied to coerce the phase difference to be within the desired range. To improve stability, the phase correction factor is increased to ±pitch/4 if the step size is one of the four maximum step sizes (1/8192 to 1/1024). To improve convergence time, the phase correction is increased to ±pitch/4 regardless of step size when the magnitude of the phase error is near the maximum, in this case 8 (representing a separation between the read pointer and write pointer of $\leq 1$ or $\geq 15$, and the pitch correction step size is increased by a power of 2. The phase corrector will evaluate whether another phase correction is appropriate on the subsequent cycles. With this system, the audible effects of phase correction to small (~0.1%) changes in the input rate are minimized, while good response time and stability are maintained.

Figure 2B:
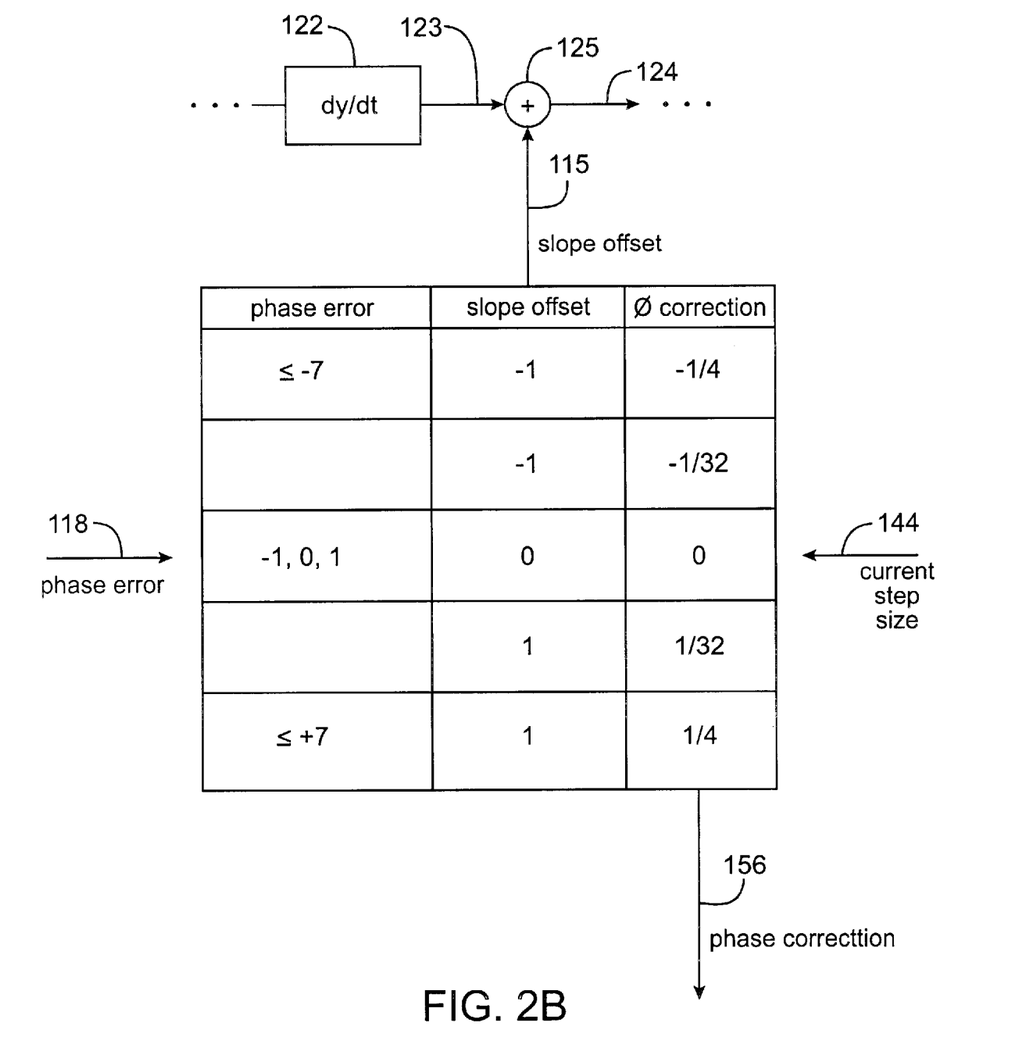
FIG. 2B is a simplified block diagram of a phase corrector according to an embodiment of the present invention.

FIG. 2B is a simplified block diagram showing additional details of the phase corrector 114. In addition to providing a phase correction signal 156, the phase corrector 114 also generates a slope offset signal 115. The slope offset signal 115 is summed 125 with the output 123 of the differentiator 122 to create an adjusted phase error slope signal 124. The slope offset signal 115 ensures that the estimated read rate is updated in the correct direction in most instances. Without the slope offset signal, the phase correction signal will not update the estimated read rate, and the read rate may lock when the phase error is not zero. In this state, the estimated read rate will be incorrect by a factor equal to the magnitude of the phase correction signal. While such a condition would likely be corrected after a short period of time if the phase error changes, providing the slope offset signal results in a read rate that produces improved phase error and convergence time.

The slope offset signal 115 is usually the same sign as the phase slope signal 123. Thus, the slope offset signal usually doesn't override the phase slope signal, but rather adds to it, for purposes of phase correction. In the instance where the phase slope is zero, the phase corrector 114 may add a 1 or a −1 to the phase slope, which would cause the step size adjuster 128 to operate through the same-slope buffer or the opposite-slope buffer, precluding operation through the zero-slope buffer, as discussed above in greater detail in relation to FIG. 3. The smaller width (size) of the same-slope and opposite-slope buffers allows quicker and more accurate adjustment of the step size in situations where the phase slope may be zero, but the phase error is not zero.

In a rare instance, the phase slope signal may have the same magnitude and opposite sign as the slope offset correction signal. While that would cause the step size adjuster to operate through the zero slope buffer, the effect, i.e. decreasing the step size, would be the same as if the step size adjuster operated through the opposite-slope buffer. Therefore, the proper adjustment to the step size would occur.

Referring again to FIG. 2A, a pointer fraction latch 160 stores an accumulated phase 162 and provides it to the second summing unit 158. The second summing unit acts as a phase accumulator, adding the output of the pitch estimator 112 and phase corrector 114 to the latched accumulated phase 162. The pointer fraction latch 160 latches the accumulated phase provided by the second summing unit 158 and is clocked at the local sampling rate. The integer portion 166 indicates the number of buffer positions the read pointer 108 should advance in the FIFO 104. A fractional portion 168 of the accumulated phase is provided to the N-point FIR 170 so that the convolver 110 can properly interpolate or decimate the read data 172 to produce the output 202.

Measured performance of this system has shown a convergence time less than 1 second that is highly accurate and stable within 65536 samples, or ~1.3 seconds at 48 kHz. With an initial pitch estimate of zero and an input write rate of 44.1 kHz, the system reports locked within 4210 sample periods (i.e., within 87.7 msec) and has a pitch estimate of 44,059.4 Hz, corresponding to an error of 0.09%. The system converges to less than the minimum error (least-significant bit, or "LSB") of ±0.18 kHz, or 0.0004% after 21,844 sample periods (455.9 msec). The time to initial lock and to minimum error will vary with the difference between the current pitch estimate and the new input write rate, but the above example is fairly typical. A locked condition is characterized by an oscillation of one LSB magnitude around the input write rate, or input pitch. This oscillation is similar to a pulse width modulated digital approximation of an analog voltage. The average of the pitch estimate over a relatively long period of time will converge to the exact pitch. The period of the oscillation is related to the ratio of the input and output sample rates, because the system is responding to phase differences.

A flag indicates whether the current pitch estimate is valid, indicating the system is locked. This flag can be used to mute the audio output from the convolver 110 to avoid audible distortion and noise when the sample rate converter is not locked to the input. The lock flag will be active when the current pitch estimate is greater than 3 kHz (i.e. a pitch greater than 1/16) and the step size is small. Hysteresis is used on the step size in order to allow for the momentary shifts in the step size that occur during the final stages of the convergence to the exact input pitch. In particular, the lock flag is set when the step size is equal to the smallest step size, but the lock flag is not reset unless the step size is equal to the largest step size. This prevents the lock flag from oscillating rapidly while the system is converging to the exact input pitch.

Figure 4A:
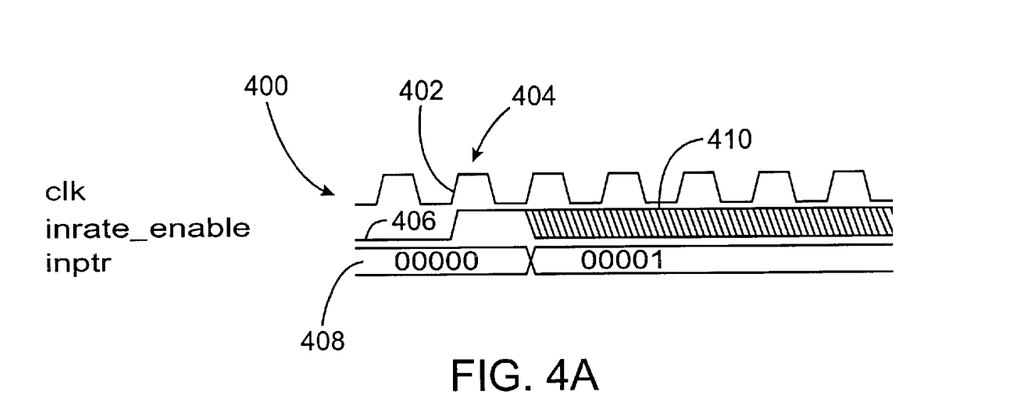
FIG. 4A is a simplified timing diagram of input events.
Figure 4B:
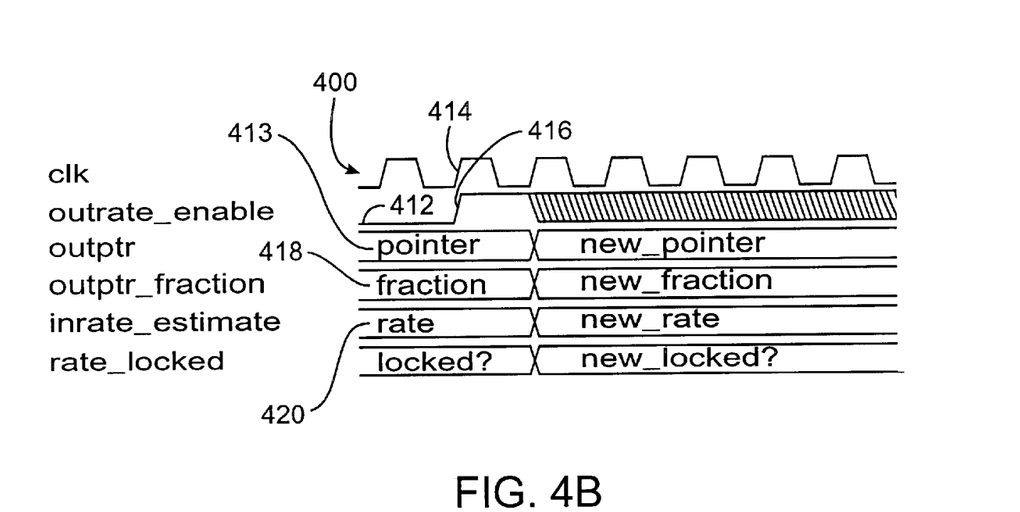
FIG. 4B is a simplified timing diagram of read events.

FIGS. 4A and 4B are simplified timing diagrams showing the relationship between the internal clock signal and other events. The entire sample rate converter, including the sample rate tracker, is synchronous with the rising edge of a clock signal. FIG. 4A shows a clock signal 400 with a rising edge 402 associated with a clock pulse 404. An input rate enable signal 406 can occur at any rising edge of a clock pulse, and transitions the input pointer 408 on the subsequent clock pulse. The hatched section 410 of the input rate enable signal indicates a don't care condition. That is, the input rate enable signal only needs to high for one clock cycle, after which it can fall to low at any clock cycle.

FIG. 4B shows the clock signal 400 and events relating to the read function. In this figure, "output" relates to the output from the FIFO buffer, and not the output from the convolver. The output rate enable signal 412 can also occur at any rising edge 414 of the clock signal. The output rate enable signal can be at any relative phase to the input rate enable signal, as long as they are both synchronous with the clock signal. The output pointer signal 413 advances the read pointer by the value generated according to the pitch estimate on each 1024th clock cycle; however, the read pointer could be advanced on each 128th or 64th clock cycle, or any rate that suits the system design. All of the output signals transition on the first rising edge of the clock signal following the rising edge 416 of an output rate enable signal 412. The FIFO pointers are designed to be used with a 32-word circular buffer consisting of a 16-word FIFO buffer and a 16-word FIR delay line. The input pointer is used to write new samples into the FIFO buffer. The output pointer points to the end of the 16-word FIR delay line, so the FIR should subtract an index from the output pointer to get each sample in the delay line. The output pointer fraction 418 is an 18-bit fractional address used for interpolation in the sample rate conversion process. The input rate estimate 420 is used to update the output pointer and the output pointer fraction. The input rate estimate is a 19-bit fixed-point unsigned number with the binary point just below bit 18 (in 1.18 format). The range of the input rate estimate is from 0.000000 to 1.999996, which restricts the asynchronous input sample rate to that range times the output sample rate. At an output sample rate of 48 KHz, the range of input sample rates that can be tracked with this system is from 0 Hz to 95,999.817 kHz. Tracking very low input sample rates is more difficult than tracking higher input sample rates because the amount of time between input samples is very long; however, several design choices could be made to improve the tracking of low input sample rates, as discussed above. When tested for the ability to track an essentially instantaneous change in the input sample rate, the system maintained lock and tracked the rate estimate with a 10% change in sample rates occurring in a single step at a nominal input sample rate of 44.1 kHz.

Those skilled in the art will recognize that the embodiments of the present invention described above may be implemented in other ways. For example, it is not necessary that the input buffer be a FIFO buffer, that the scaler be a shift register, or that a convolver be used to scale the output. Further, while the circuit is described as applying to an digital audio application, the circuit could apply to other applications, including applications with significantly different data rates, and systems with multiple read pointers or multiple write pointers. The circuit could be adapted to maintain other phase relationships between any or all pointers, and the phase relationships could vary. Accordingly, the disclosure of the invention is intended to be illustrative, but not limiting, of the scope of the invention, which is set forth in the following claims.

What is claimed is:

1. An asynchronous digital sample rate tracking apparatus for use with an asynchronous digital rate converter, the asynchronous digital rate converter having an internal data rate, the apparatus comprising:

a serial buffer receiving input data at an input data rate;

a write pointer at a first buffer position, the write pointer moving to a second buffer position at an input sample rate;

a read pointer at a third buffer position, the read pointer moving to a fourth buffer position at a read rate, the read pointer being separated from the write pointer by a phase angle;

a buffer phase detector detecting the first buffer position and the third buffer position and producing a phase error signal, the phase error signal indicating the difference between the phase angle and a desired phase angle;

a differentiator receiving the phase error signal on a first cycle and a second phase error signal on a second cycle and producing a phase error rate signal, the phase error rate signal having a phase error rate signal amplitude;

a pitch correction step size register providing a current pitch step size signal;

a scaler receiving the phase error rate signal and the current pitch step size signal and producing a new estimated pitch correction step size based on the phase error rate signal amplitude and the current pitch step size signal; and a step size adjuster, the step size adjuster receiving the phase error rate signal, the phase error rate signal having a phase error rate sign, wherein the step size adjuster includes:

a first counter responding to the phase error rate sign when the phase error rate sign is the same as a prior phase error rate sign, and producing a step size increase signal when the first counter reaches a first counter limit;

a second counter responding to the phase error rate sign when the phase error rate sign is different from the prior phase error rate sign, and producing a first step size decrease signal when the second counter reaches a second counter limit; and a third counter responding to the phase error rate sign when the phase error rate sign is zero, and producing a second step size decrease signal when the third counter reaches a third counter limit, wherein the step size increase signal, the first step size decrease signal, and the second step size decrease signal are provided to the step size register to produce the current pitch step size signal.

2. The apparatus of claim 1 wherein the scaler is a shift register.

3. The apparatus of claim 1 wherein the first counter, second counter or third counter is an overflow buffer.

4. The apparatus of claim 1 wherein the first counter limit is not equal to the second counter limit.

5. The apparatus of claim 1 wherein the input sample rate is essentially equal to the internal data rate.

6. The apparatus of claim 1 further comprising:
   a summing unit receiving the new estimated pitch step size; and
   a pitch generator including a pitch register, the pitch register providing a current pitch signal to the summing unit,
   wherein the pitch generator produces an estimated pitch signal from a new pitch step size provided to the pitch generator from the summing unit.

7. The apparatus of claim 6 further comprising a phase corrector, wherein the phase corrector produces a phase correction signal based on and proportional to the estimated pitch signal, the current pitch step size signal and the phase error signal, the phase correction signal being a fraction of the estimated pitch signal and being added to the estimated pitch signal to produce a current pitch signal.

8. The apparatus of claim 6 wherein the phase corrector further produces a slope offset signal according to the phase angle, the slope offset signal being added to the phase error rate signal, the sum of the phase error rate signal and the slope offset signal being provided to the scaler and to the step size adjuster.

9. The apparatus of claim 8 wherein the slope offset signal has a value of one when the phase angle is within a first selected range, a value of zero when the phase angle is within a second selected range, and a value of negative one when the phase angle is within a third selected range.

10. The apparatus of claim 9 wherein the second selected range is a phase angle of zero, plus and minus one.

11. An asynchronous digital sample rate tracking apparatus for use with an asynchronous digital rate converter, the asynchronous digital rate converter having an internal data rate, the apparatus comprising:
    a serial buffer receiving input data at an input data rate;
    a write pointer at a first buffer position, the write pointer moving to a second buffer position at an input sample rate;
    a read pointer at a third buffer position, the read pointer moving to a fourth buffer position at a read rate, the read pointer being separated from the write pointer by a phase angle;
    a buffer phase detector detecting the first buffer position and the third buffer position and producing a phase error signal, the phase error signal indicating the difference between the phase angle and a desired phase angle;
    a differentiator receiving the phase error signal on a first cycle and a second phase error signal on a second cycle and producing a phase error rate signal, the phase error rate signal having a phase error rate signal amplitude;
    a slope summing unit receiving the phase error rate signal and a slope offset signal to produce an adjusted phase error rate signal;
    a step size adjuster, the step size adjuster receiving the adjusted phase error rate signal, the adjusted phase error rate signal having a phase error rate sign, wherein the step size adjuster includes:
        a first counter responding to the phase error rate sign when the phase error rate sign is the same as a prior phase error rate sign, and producing a step size increase signal when the first counter reaches a first counter limit;
        a second counter responding to the phase error rate sign when the phase error rate sign is different from the prior phase error rate sign, and producing a first step size decrease signal when the second counter reaches a second counter limit; and
        a third counter responding to the phase error rate sign when the phase error rate sign is zero, and producing a second step size decrease signal when the third counter reaches a third counter limit, wherein the step size increase signal, the first step size decrease signal, and the second step size decrease signal are provided to
    a step size register to produce a current pitch step size signal, the step size register storing the current pitch step size signal and providing the current pitch step size signal to
    a scaler receiving the current pitch step size signal and the adjusted phase error rate signal to produce a new estimated pitch correction step size;
    a summing unit receiving the new estimated pitch step size and a current pitch signal from a pitch register of
    a pitch generator, wherein the pitch generator produces an estimated pitch signal from a new pitch step size provided to the pitch generator from the summing unit; and
    a phase corrector, wherein the phase corrector produces a phase correction signal based on and proportional to the estimated pitch signal, the current pitch step size signal and the phase error signal, the phase correction signal being a fraction of the estimated pitch signal and being added to the estimated pitch signal to produce a current pitch signal, the phase corrector further producing a slope offset signal according to the phase angle, the slope offset signal being provided to the slope summing unit.

* * * * *